(12) United States Patent
Kanda et al.

(10) Patent No.: US 9,190,166 B2
(45) Date of Patent: Nov. 17, 2015

(54) MEMORY ELEMENT, SEMICONDUCTOR DEVICE, AND WRITING METHOD

(71) Applicant: Sony Corporation, Tokyo (JP)

(72) Inventors: Yasuo Kanda, Kanagawa (JP); Koichi Amari, Kanagawa (JP); Shunsaku Tokitou, Kanagawa (JP); Yuji Torige, Kanagawa (JP); Takayuki Arima, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 4 days.

(21) Appl. No.: 14/155,790

(22) Filed: Jan. 15, 2014

(65) Prior Publication Data

US 2014/0204649 A1    Jul. 24, 2014

(30) Foreign Application Priority Data

Jan. 23, 2013    (JP) .................................. 2013-010433

(51) Int. Cl.
*G11C 17/00*    (2006.01)
*G11C 17/16*    (2006.01)
*G11C 17/18*    (2006.01)

(52) U.S. Cl.
CPC .............. *G11C 17/165* (2013.01); *G11C 17/18* (2013.01); *H01L 2924/0002* (2013.01)

(58) Field of Classification Search
CPC ...... G11C 17/18; G11C 17/16; G11C 29/785; G11C 29/787; G11C 19/00; G11C 29/52; G11C 29/838
USPC ...................... 365/225.7, 96, 164, 189.03, 63
See application file for complete search history.

(56) References Cited

U.S. PATENT DOCUMENTS 7,482,854 B2 *    1/2009   Choi et al. ................. 365/225.7

FOREIGN PATENT DOCUMENTS

JP          2000-174211          6/2000

* cited by examiner

*Primary Examiner* — Thong Q Le
(74) *Attorney, Agent, or Firm* — Hazuki International, LLC

(57) ABSTRACT

A memory element includes: an electrical fuse provided to be inserted between a first input node and a second input node; and an antifuse provided to be inserted between the second input node and a third input node. The third input node is configured to be a node to which a voltage is allowed to be applied separately from a voltage to be applied to the first input node.

14 Claims, 13 Drawing Sheets

MEMORY ELEMENT, SEMICONDUCTOR DEVICE, AND WRITING METHOD

CROSS REFERENCE TO RELATED APPLICATIONS

This application claims the benefit of Japanese Priority Patent Application JP2013-10433 filed Jan. 23, 2013, the entire contents of which are incorporated herein by reference.

BACKGROUND

The present disclosure relates to a memory element that stores therein information by utilizing such a property that a resistance value changes. The present disclosure also relates to a semiconductor device provided with such a memory element, and a writing method by which information is written to such a memory element.

In many cases, an OTP (One Time Programmable) memory to which data is allowed to be written only once, and an MTP (Multi-Time Programmable) memory to which data is allowed to be written two or more times, are integrated in a semiconductor integrated circuit. These types of memories may store therein, for example, trimming information used to adjust circuit properties. Thus, such a semiconductor integrated circuit is allowed to realize desirable properties, by making an adjustment based on the trimming information stored in a memory thereof, immediately after power-on. Further, an identification (ID) number of a semiconductor integrated circuit may also be stored to realize traceability of this semiconductor integrated circuit.

In a memory like those described above, an electrical fuse is often used as a memory element. In the electrical fuse, a resistance value is increased by application of a stress. Further, an antifuse may be used as a memory element in some cases. In the antifuse, a resistance value is decreased by application of a stress. Furthermore, a memory element may be configured using both the electrical fuse and the antifuse. For example, Japanese Unexamined Patent Application Publication No. 2000-174211 discloses a semiconductor trimming device in which an antifuse is connected in parallel, to a series circuit in which an electrical fuse and a resistor are connected in series. This semiconductor trimming device causes both terminals of the memory element to open, by increasing the resistance value of the electrical fuse, and also causes both terminals of the memory element to short-circuit, by decreasing the resistance value of the antifuse.

SUMMARY

In a case in which a memory element is configured using both an electrical fuse and an antifuse like the one described above, desirably, when a stress is applied to one of the electrical fuse and the antifuse, the other may not be damaged. In other words, for example, when the antifuse is affected by application of a stress to the electrical fuse, a memory state may become unstable, thereby reducing reliability of stored information.

It is desirable to provide a memory element, a semiconductor device, and a writing method, which are capable of increasing reliability of stored information.

According to an embodiment of the present disclosure, there is provided a memory element including: an electrical fuse provided to be inserted between a first input node and a second input node; and an antifuse provided to be inserted between the second input node and a third input node, the third input node being configured to be a node to which a voltage is allowed to be applied separately from a voltage to be applied to the first input node.

According to an embodiment of the present disclosure, there is provided a semiconductor device including: an electrical fuse provided to be inserted between a first input node and a second input node; an antifuse provided to be inserted between the second input node and a third input node; and a control section configured to apply a stress voltage to the second input node, and to apply a voltage to each of the first input node and the third input node separately.

According to an embodiment of the present disclosure, there is provided a writing method including: applying a first stress voltage to a second input node of a memory element to change a resistive state of an electrical fuse, the memory element including the electrical fuse provided to be inserted between a first input node and the second input node, and an antifuse provided to be inserted between the second input node and a third input node, the first stress voltage having a same polarity as a polarity of a voltage of the third input node; and applying a second stress voltage to the second input node of the memory element to change a resistive state of the antifuse, the second stress voltage having a polarity different from the polarity of the voltage of the third input node.

In the memory element, the semiconductor device, and the writing method according to the above-described embodiments of the present disclosure, the electrical fuse is provided to be inserted between the first input node and the second input node, and the antifuse is provided to be inserted between the second input node and the third input node. A voltage is applied to each of the first input node and the third input node separately.

According to the memory element, the semiconductor device, and the writing method of the above-described embodiments of the present disclosure, a voltage is applied to each of the first input node and the third input node separately. Therefore, reliability of stored information is allowed to be increased.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

An embodiment of the present disclosure will be described below in detail with reference to the drawings.
[Configuration Example]
(Overall Configuration Example)

Figure 1:
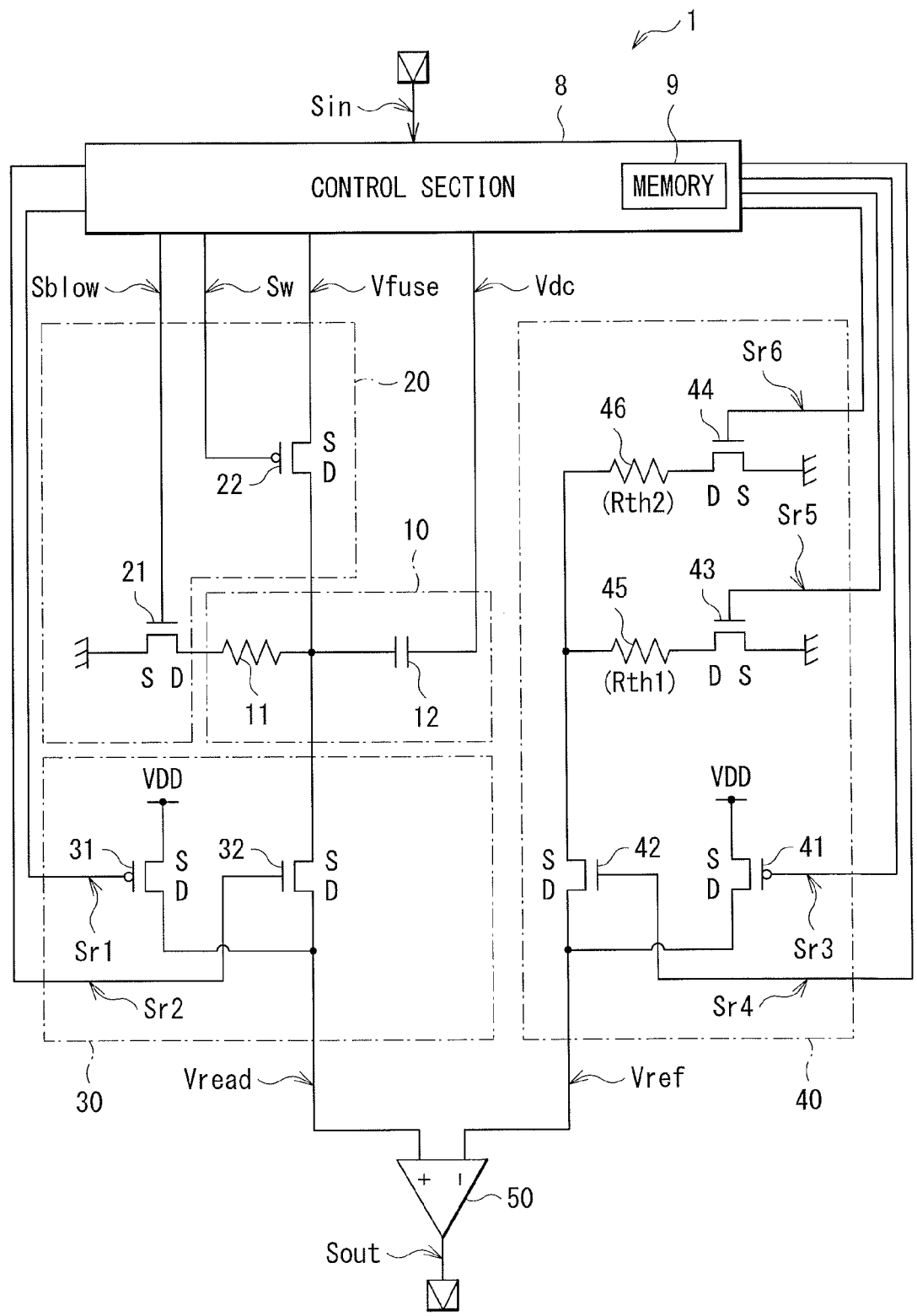
FIG. 1 is a circuit diagram illustrating a configuration example of a semiconductor device according to an embodiment of the present disclosure.

FIG. 1 illustrates a configuration example of a semiconductor device (a semiconductor device 1) according to an embodiment. The semiconductor device 1 includes both an electrical fuse and an antifuse, and is a memory to which information is allowed to be written up to three times. It is to be noted that each of a memory element and a writing method according to an embodiment of the present disclosure is realized by the present embodiment and thus will be described together.

The semiconductor device 1 includes a control section 8, a memory element 10, a write section 20, a readout section 30, a reference-voltage generation section 40, and a comparator 50.

The control section 8 controls writing information to the memory element 10 and reading information stored in the memory element 10, based on a signal Sin inputted from outside. Specifically, the control section 8 supplies: a voltage Vdc to the memory element 10; control signals Sblow and Sw as well as a voltage Vfuse to the write section 20; control signals Sr1 and Sr2 to the readout section 30; and control signals Sr3 to Sr6 to the reference-voltage generation section 40, thereby controlling these blocks. The control section 8 includes a memory 9. The number of writing operations performed for the memory element 10 in the past is stored in the memory 9, as will be described later. Based on the information stored in the memory 9, the control section 8 generates the voltages Vdc and Vfuse as well as the control signals Sblow, Sw, and Sr1 to Sr6, thereby controlling these blocks.

The memory element 10 stores information therein. The memory element 10 includes an electrical fuse 11 and an antifuse 12. In FIG. 1, the electrical fuse 11 is illustrated using a symbol of a resistor, and the antifuse 12 is illustrated using a symbol of a capacitor.

In the electrical fuse 11, a resistive state is changed to increase a resistance value thereof, by application of a stress. The electrical fuse 11 has three identifiable resistive states (a low resistive state, a middle resistive state, and a high resistive state) as will be described later. One end of the electrical fuse 11 is connected to one end of the antifuse 12, and also connected to a drain of a write transistor 22 (to be described later) of the write section 20, and the like. The other end of the electrical fuse 11 is connected to a drain of a blow transistor 21 (to be described later) of the write section 20.

In the antifuse 12, a resistive state is changed to decrease a resistance value thereof, by application of a stress. The one end of the antifuse 12 is connected to the one end of the electrical fuse 11, and also connected to the drain of the write transistor 22 (to be described later) of the write section 20, and the like. To the other end of the antifuse 12, the voltage Vdc is supplied from the control section 8. The voltage Vdc is a positive voltage Vdc1 (voltage Vdc1>0) when information is written to the memory element 10, and 0 V when information is read from the memory element 10, as will be described later.

The write section 20 writes information to the memory element 10. The write section 20 includes the blow transistor 21 and the write transistor 22. The blow transistor 21 may be configured of, for example, an N-channel MOS (Metal Oxide Semiconductor) FET (Field Effect Transistor). The write transistor 22 may be configured of, for example, a P-channel MOS FET. Of the blow transistor 21, the drain is connected to the other end of the electrical fuse 11, the gate is supplied with the control signal Sblow from the control section 8, and the source is grounded. The blow transistor 21 functions as a switch that becomes ON state when the control signal Sblow becomes high level. The drain of the write transistor 22 is connected to the one end of the electrical fuse 11, the one end of the antifuse 12, and the like. The gate of the write transistor 22 is supplied with the control signal Sw from the control section 8, and the source of the same is supplied with the voltage Vfuse from the control section 8. The write transistor 22 functions as a switch that becomes ON state when the control signal Sw becomes low level. As will be described later, the voltage Vfuse is a positive voltage Vef (voltage Vef>0) when a stress is applied to the electrical fuse 11, and a negative voltage Vaf (voltage Vaf<0) when a stress is applied to the antifuse 12. It is to be noted that, in this example, the write transistor 22 is assumed to be the P-channel MOS FET, but is not limited thereto. Alternatively, the write transistor 22 may be, for example, an N-channel MOS FET, or a so-called transmission gate configured using a P-channel MOS FET and an N-channel MOS FET.

With this configuration, the blow transistor 21 and the write transistor 22 both become ON state, at the time of writing information to the memory element 10, as will be described later. Thus, the voltage Vfuse (the voltage Vef or Vaf) is applied to the memory element 10. In the memory element 10, when the positive voltage Vef is applied as the voltage Vfuse, a stress (a stress ST1 or ST2 to be described later) is applied to the electrical fuse 11, and a resistance value of the electrical fuse 11 changes to a high value. When the negative voltage Vaf is applied as the voltage Vfuse, a stress (a stress ST3 to be described later) is applied to the antifuse 12, and a resistance value of the antifuse 12 changes to a small value.

The readout section 30 generates a readout voltage Vread corresponding to a resistive state in the electrical fuse 11 and the antifuse 12, when reading information from the memory element 10. The readout section 30 includes transistors 31 and 32. The transistor 31 may be configured of, for example, a P-channel MOS FET, and the transistor 32 may be configured of, for example, an N-channel MOS FET. The drain of the transistor 31 is connected to the drain of the transistor 32, and also connected to a positive input terminal of the comparator 50. The gate of the transistor 31 is supplied with the control signal Sr1 from the control section 8, and the source of the same is supplied with a power supply voltage VDD. The transistor 31 functions as a switch that becomes ON state when the control signal Sr1 becomes low level. The drain of the transistor 32 is connected to the drain of the transistor 31, and also connected to the positive input terminal of the comparator 50. The gate of the transistor 32 is supplied with the control signal Sr2 from the control section 8, and the source of the same is connected to the one end of the electrical fuse 11, the one end of the antifuse 12, and the like. The transistor 32 functions as a switch that becomes ON state when the control signal Sr2 becomes high level.

The reference-voltage generation section 40 generates a reference voltage Vref becoming a reference (a threshold) to be compared with the readout voltage Vread, at the time of reading information from the memory element 10. The reference-voltage generation section 40 includes transistors 41 to 44, and resistors 45 and 46.

The transistor 41 may be configured of, for example, a P-channel MOS FET, and the transistors 42 to 44 may be each configured of, for example, an N-channel MOS FET. The drain of the transistor 41 is connected to the drain of the transistor 42, and also connected to a negative input terminal of the comparator 50. The gate of the transistor 41 is supplied with the control signal Sr3 from the control section 8, and the source of the same is supplied with a power supply voltage VDD. The transistor 41 functions as a switch that becomes ON state when the control signal Sr3 becomes low level. The drain of the transistor 42 is connected to the drain of the transistor 41, and also connected to the negative input terminal of the comparator 50. The gate of the transistor 42 is supplied with the control signal Sr4 from the control section 8, and the source of the same is connected to one end of the resistor 45 and one end of the resistor 46. The transistor 42 functions as a switch that becomes ON state when the control signal Sr4 becomes high level. Of the transistor 43, the drain is connected to the other end of the resistor 45, the gate is supplied with the control signal Sr5 from the control section 8, and the source is grounded. The transistor 43 functions as a switch that becomes ON state when the control signal Sr5 becomes high level. Of the transistor 44, the drain is connected to the other end of the resistor 46, the gate is supplied with the control signal Sr6, and the source is grounded. The transistor 44 functions as a switch that becomes ON state when the control signal Sr6 becomes high level.

The resistor 45 has a resistance value Rth1. The one end of the resistor 45 is connected to the source of the transistor 42 and the one end of the resistor 46. The other end of the resistor 45 is connected to the drain of the transistor 43. The resistance value Rth1 is a resistance value (ReL<Rth1<ReM) between a resistance value ReL in the low resistive state of the electrical fuse 11 and a resistance value ReM in the middle resistive state of the same. The resistor 46 has a resistance value Rth2 that is larger than the resistance value Rth1. The one end of the resistor 46 is connected to the source of the transistor 42 and the one end of the resistor 45. The other end of the resistor 46 is connected to the drain of the transistor 44. The resistance value Rth2 is a resistance value (ReM<Rth2<ReH) between the resistance value ReM in the middle resistive state of the electrical fuse 11 and a resistance value ReH in the high resistive state of the same.

The comparator 50 compares the readout voltage Vread supplied from the readout section 30 with the reference voltage Vref supplied from the reference-voltage generation section 40, and outputs a comparison result as a signal Sout.

With this configuration, at the time of reading information from the memory element 10, the readout section 30 generates the readout voltage Vread corresponding to the resistive state of each of the electrical fuse 11 and the antifuse 12 in the memory element 10, and the reference-voltage generation section 40 generates the reference voltage Vref. The comparator 50 then compares the readout voltage Vread with the reference voltage Vref. Specifically, in the write section 20, the blow transistor 21 becomes ON state, and the voltage Vdc of 0 V is supplied to the other end of the antifuse 12, as will be described later. Thus, 0 V is applied to both of the other end of the electrical fuse 11 and the other end of the antifuse 12, and the electrical fuse 11 and the antifuse 12 enter a state equivalent to a state of being connected to each other in parallel. Further, in the readout section 30, the transistors 31 and 32 both enter ON state, a current flows from a power supply to the memory element 10 through the transistors 31 and 32, so that the readout voltage Vread is generated. Meanwhile, in the reference-voltage generation section 40, the transistors 41, 42, and 43 or the transistors 41, 42, and 44 enter ON state, so that the reference voltage Vref corresponding to the resistance value Rth1 or the resistance value Rth2 is generated. The comparator 50 then compares the readout voltage Vread with the reference voltage Vref, so that information is read out.

(Memory Element 10)

Figure 2:
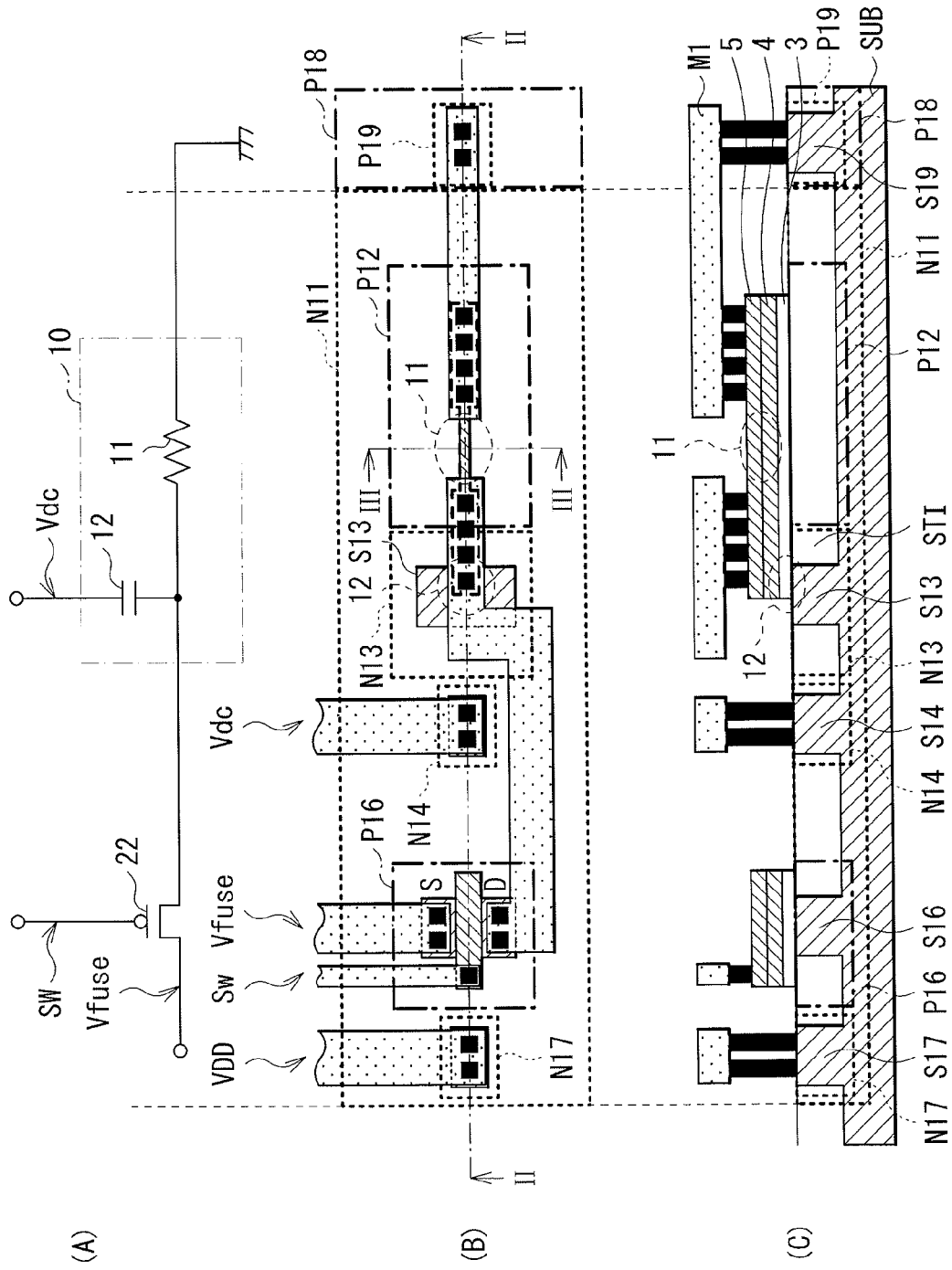
FIG. 2 is a layout diagram of a memory element illustrated in FIG. 1.

FIG. 2 illustrates an example of a layout of the memory element 10 and the write transistor 22. Part (A) of FIG. 2 illustrates a circuit diagram, Part (B) of FIG. 2 illustrates a plan view, and Part (C) of FIG. 2 illustrates a cross-sectional diagram taken along a line indicated by arrows II and viewed in a direction indicated by the arrows II in Part (B) of FIG. 2. It is to be noted that, in this example, the other end of the electrical fuse 11 is grounded for convenience of description.

In a substrate SUB that is a silicon substrate, an N-well N11 and a P-well P18 are formed. In addition, on a surface of the substrate SUB except a part thereof, an oxide film STI (Shallow Trench Isolation) is formed.

In the N-well N11, diffusion layers P12, N13, N14, P16, and N17 are formed. The diffusion layers P12 and P16 are P-type diffusion layers, and the diffusion layers N13, N14, and N17 are N-type diffusion layers. On the oxide film STI in the diffusion layer P12, an insulating layer 3, a polysilicon layer 4, and a silicide layer 5 are formed to be laminated in this order and also to extend in one direction. Of these, the polysilicon layer 4 and the silicide layer 5 are used to configure the electrical fuse 11. In the electrical fuse 11, as will be described later, application of a stress causes the silicide layer 5 to dissolve or the polysilicon layer 4 to change into an amorphous state, thereby changing the resistance value. On each of both sides of the electrical fuse 11 in an extending direction thereof, a contact CNT used for conduction to a wiring layer M1 is formed. The diffusion layer N13 has a part (a silicon part S13) where the oxide film STI is not formed. The three layers of the insulating layer 3, the polysilicon layer 4, and the silicide layer 5 extend to the top of the silicon part S13. A part where these three layers and the silicon part S13 overlap each other is used to configure the antifuse 12. In other words, the antifuse 12 is configured such that the insulating layer 3 is to be damaged and the resistance value is to be reduced by application of a stress. The diffusion layer N14 is provided to supply an electric potential to the N-well N11. The diffusion layer N14 has a part (a silicon part S14) where the oxide film STI is not formed, and a contact CNT for conduction to the wiring layer M1 is formed on the silicon part S14.

The diffusion layer P16 has a part (a silicon part S16) where the oxide film STI is not formed, and the write transistor 22 is formed at the silicon part S16. The drain of the write transistor 22 is connected to the one end of the electrical fuse 11 and the one end of the antifuse 12, through a contact CNT and the wiring layer M1. The diffusion layer N17 is provided to supply an electric potential (a power supply voltage VDD) to the N-well N11. The diffusion layer N17 has a part (a silicon part S17) where the oxide film STI is not formed, and a contact CNT for conduction to the wiring layer M1 is formed on the silicon part S17.

In the P-well P18, a diffusion layer P19 is formed. The diffusion layer P19 is a P-type diffusion layer. The diffusion layer P19 has a part (a silicon part S19) where the oxide film STI is not formed, and a contact CNT for conduction to the wiring layer M1 is formed on the silicon part S19. In this example, the P-well P18 is grounded, and an electric potential (0 V) is supplied to the other end of the electrical fuse 11, through the contact CNT and the wiring layer M1.

Figure 3:
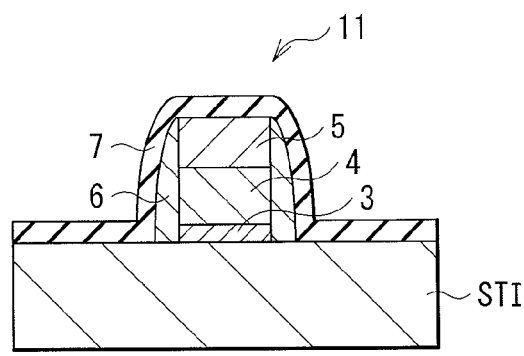
FIG. 3 is a cross-sectional diagram illustrating a configuration example of an electrical fuse illustrated in FIG. 1.

FIG. 3 illustrates a cross-sectional diagram of the electrical fuse 11, taken along a line indicated by arrows III and viewed in a direction indicated by the arrows III in FIG. 2. As illustrated in FIG. 3, the electrical fuse 11 includes the polysilicon layer 4 formed on the insulating layer 3, and the silicide layer 5 formed on the polysilicon layer 4. The polysilicon layer 4 has crystallinity in an initial state in which a stress is not applied. Side faces of each of the insulating layer 3, the polysilicon layer 4, and the silicide layer 5 are each provided with a side wall 6 that may be configured of, for example, an oxide film, a nitride film, or the like. Further, a protective film 7 (an insulating film) is provided to cover the silicide layer 5, the side wall 6, and the oxide film STI.

It is to be noted that the configuration of the electrical fuse 11 is not limited to the example illustrated in FIG. 3, and may be any configuration as long as the polysilicon layer 4 and the silicide layer 5 are included therein. For example, the side wall 6 and the protective film 7 may not be formed.

Next, the resistive state in the electrical fuse 11 will be described. The electrical fuse 11 has three identifiable resistive states (the low resistive state, the middle resistive state, and the high resistive state). The low resistive state is an initial state in which a stress is not applied, and each of the middle resistive state and the high resistive state is a state after a stress is applied.

Figure 4:
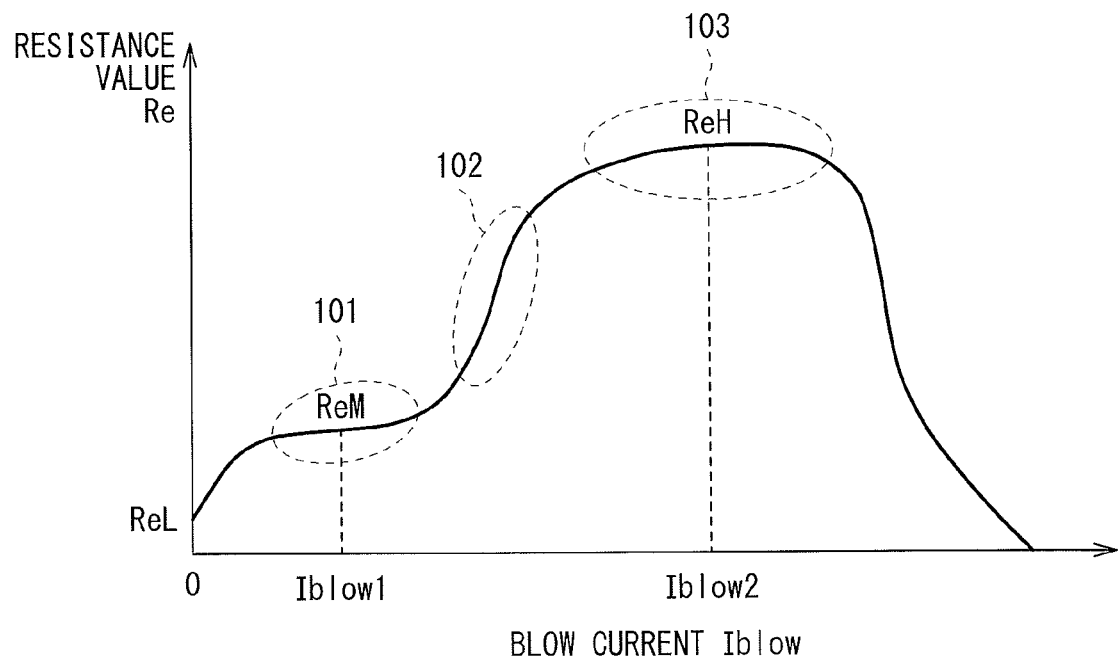
FIG. 4 is a characteristic diagram illustrating a characteristic example of the electrical fuse illustrated in FIG. 1.

FIG. 4 illustrates a relationship between a resistance value Re of the electrical fuse 11 and a stress applied to the electrical fuse 11. In this example, a stress is applied to the electrical fuse 11 by supplying a current (hereinafter referred to as a blow current Iblow) to the electrical fuse 11.

In the state in which a stress is not applied, the resistance value Re is the resistance value ReL. Here, the resistance value ReL may be, for example, about some hundreds of ohms. When the blow current Iblow is fed to the electrical fuse 11 in this low resistive state (the resistance value ReL), the electrical fuse 11 produces heat, and the resistance value Re increases to be greater than the resistance value ReL of the low resistive state. Subsequently, when the blow current Iblow becomes substantially a current Iblow1, the resistance value Re of the electrical fuse 11 becomes saturated (a saturation range 101) to be substantially the resistance value ReM (the middle resistive state). The resistance value ReM in this middle resistive state may be, for example, about some thousands of ohms In the saturation range 101, salicide EM (Electro Migration) occurs at the electrical fuse 11.

Figure 5:
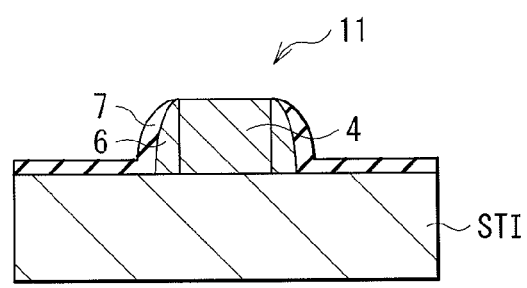
FIG. 5 is a cross-sectional diagram illustrating an example of a middle resistive state in the electrical fuse illustrated in FIG. 1.

FIG. 5 illustrates a state (a salicide EM state) in which the salicide EM is occurring at the electrical fuse 11. As illustrated in FIG. 5, the salicide EM state is a state in which the silicide layer 5 is no longer present after dissolving, and the polysilicon layer 4 remains. In such a state, even if the blow current Iblow is slightly changed, the polysilicon layer 4 is hardly damaged and therefore, the resistance value Re of the electrical fuse 11 hardly changes from the resistance value ReM.

When the blow current Iblow is further increased, the resistance value of the electrical fuse 11 starts increasing (a range 102). In this state, the polysilicon layer 4 begins to dissolve (Si melting). Subsequently, when the blow current Iblow becomes substantially a current Iblow2, the resistance value Re of the electrical fuse 11 becomes saturated again (a saturation range 103) to be substantially the resistance value ReH (the high resistive state). The resistance value ReH in this high resistive state may be, for example, about some tens of thousands of ohms. In the saturation range 103, the polysilicon layer 4 of the electrical fuse 11 is damaged.

Figure 6:
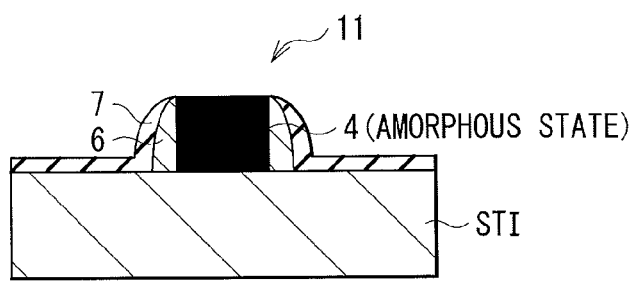
FIG. 6 is a cross-sectional diagram illustrating an example of a high resistive state of the electrical fuse illustrated in FIG. 1.

FIG. 6 illustrates a state in which the electrical fuse 11 is damaged. In this example, the polysilicon layer 4 is in an amorphous state. Further, for example, the polysilicon layer 4 may also be partially cut, or partially deformed. In this situation, the state of the polysilicon layer 4 hardly changes even if the blow current Iblow is changed. Therefore, even if the blow current Iblow is changed, the resistance value Re of the electrical fuse 11 hardly changes from the resistance value ReH.

In this way, the electrical fuse 11 has the three resistive states (the low resistive state, the middle resistive state, and the high resistive state), and changes to a state in which the resistance value Re is higher, depending on a stress.

On the other hand, the antifuse 12 has two resistive states (a low resistive state and a high resistive state). A resistance value Ra of the antifuse 12 changes to a lower value depending on a stress. Specifically, in a state in which a stress is not applied, the resistance value Ra of the antifuse 12 is a resistance value RaH (the high resistive state). When a stress is then applied, the resistance value Ra of the antifuse 12 changes to a resistance value RaL (the low resistive state). The resistance value RaL may be, for example, about some hundreds of ohms.

With this configuration, it is possible to apply a stress (the stresses ST1 to ST3) to the memory element 10 up to three times. The stress ST1 changes the resistive state of the electrical fuse 11 from the low resistive state (the resistance value ReL) to the middle resistive state (the resistance value ReM). The stress ST2 changes the resistive state of the electrical fuse 11 to the high resistive state (the resistance value ReH). The stress ST3 changes the resistive state of the antifuse 12 from the high resistive state (the resistance value RaH) to the low resistive state (the resistance value RaL). Conditions (a voltage, a current, and a period) of the stresses ST1 to ST3 are set to be different between these stresses, as will be described later.

Figure 7A:
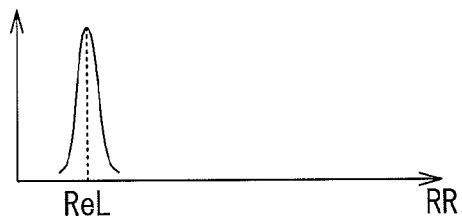
FIGS. 7A to 7D are characteristic diagrams each illustrating a characteristic example of the memory element illustrated in FIG. 1.
Figure 7B:
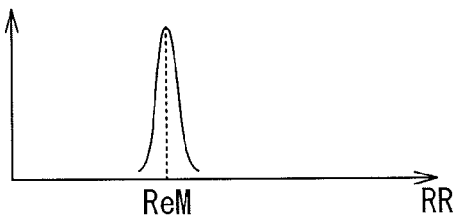
Figure 7C:
Figure 7D:
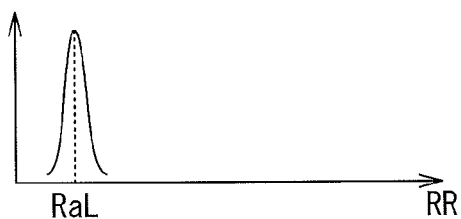

FIGS. 7A to 7D illustrate changes in a resistance value RR of the entire memory element 10, when the stresses ST1 to ST3 are applied. The resistance value RR is a resistance value when the electrical fuse 11 and the antifuse 12 are connected in parallel. In other words, at the time of reading information from the memory element 10, the resistance value RR is used as a value indicating the resistive state of the entire memory element 10, in consideration of entering a state equivalent to a state in which the electrical fuse 11 and the antifuse 12 are connected to each other in parallel. FIG. 7A illustrates a distribution of the resistance value RR in the initial state (the state before application of a stress), and FIG. 7B illustrates a distribution of the resistance value RR after application of the stress ST1. FIG. 7C illustrates a distribution of the resistance value RR after application of the stress ST2, and FIG. 7D illustrates a distribution of the resistance value RR after application of the stress ST3.

In the initial state, the electrical fuse 11 is in the low resistive state (the resistance value ReL), and the antifuse 12 is in the high resistive state (the resistance value RaH). Therefore, the resistance value RR of the entire memory element 10 is substantially equal to the resistance value ReL, as illustrated in FIG. 7A.

When the stress ST1 is applied, the resistive state of the electrical fuse 11 becomes the middle resistive state (the resistance value ReM). At this moment, the resistive state of the antifuse 12 remains in the high resistive state (the resistance value RaH). Therefore, the resistance value RR of the entire memory element 10 is substantially equal to the resistance value ReM, as illustrated in FIG. 7B.

Further, when the stress ST2 is applied, the resistive state of the electrical fuse 11 becomes the high resistive state (the resistance value ReH). At this moment, the resistive state of the antifuse 12 remains in the high resistive state (the resistance value RaH). Therefore, the resistance value RR of the entire memory element 10 is substantially equal to the resistance value ReH, as illustrated in FIG. 7C.

Furthermore, when the stress ST3 is applied, the resistive state of the antifuse 12 becomes the low resistive state (the resistance value RaL). Therefore, the resistance value RR of the entire memory element 10 is substantially equal to the resistance value RaL, as illustrated in FIG. 7D.

In this way, it is possible to apply a stress (the stresses ST1 to ST3) to the memory element 10 up to three times. Thus, in the semiconductor device 1, it is possible to write information up to three times. In other words, unlike a so-called OTP in which information is allowed to be written only once, information is allowed to be rewritten more than once in the semiconductor device 1.

Here, the other end of the electrical fuse 11 corresponds to a specific but not limitative example of "first input node" in one embodiment of the present disclosure. The one end of the electrical fuse 11 and the one end of the antifuse 12 correspond to a specific but not limitative example of "second input node" in one embodiment of the present disclosure. The other end of the antifuse 12 corresponds to a specific but not limitative example of "third input node" in one embodiment of the present disclosure. Here, "node" does not necessarily represent a nodal point, and represents any one point on a circuit. A voltage Vef1 corresponds to a specific but not limitative example of "first stress voltage" in one embodiment of the present disclosure. A voltage Vaf corresponds to a specific but not limitative example of "second stress voltage" in one embodiment of the present disclosure. A voltage Vef2 corresponds to a specific but not limitative example of "third stress voltage" in one embodiment of the present disclosure. The control section 8 and the write section 20 correspond to a specific but not limitative example of "control section" in one embodiment of the present disclosure. The reference-voltage generation section 40 corresponds to a specific but not limitative example of "voltage generation section" in one embodiment of the present disclosure. The comparator 50 corresponds to a specific but not limitative example of "comparator" in one embodiment of the present disclosure.

[Operation and Functions]
Next, operation and functions of the semiconductor device 1 of the present embodiment will be described.
(Summary of Overall Operation)
First, a summary of overall operation of the semiconductor device 1 will be described with reference to FIG. 1, etc. The control section 8 controls writing information to the memory element 10 and reading information stored in the memory element 10. The write section 20 writes information to the memory element 10. The readout section 30 generates the readout voltage Vread corresponding to the resistive state in each of the electrical fuse 11 and the antifuse 12 of the memory element 10, when reading information from the memory element 10. The reference-voltage generation section 40 generates the reference voltage Vref. The comparator 50 compares the readout voltage Vread with the reference voltage Vref, and outputs a comparison result as the signal Sout.
(Detailed Operation)
In the semiconductor device 1, it is possible to write information to the electrical fuse 11 twice, and then write information to the antifuse 12 once. In other words, in the semiconductor device 1, it is possible to write information to the memory element 10 up to three times.

Figure 8:
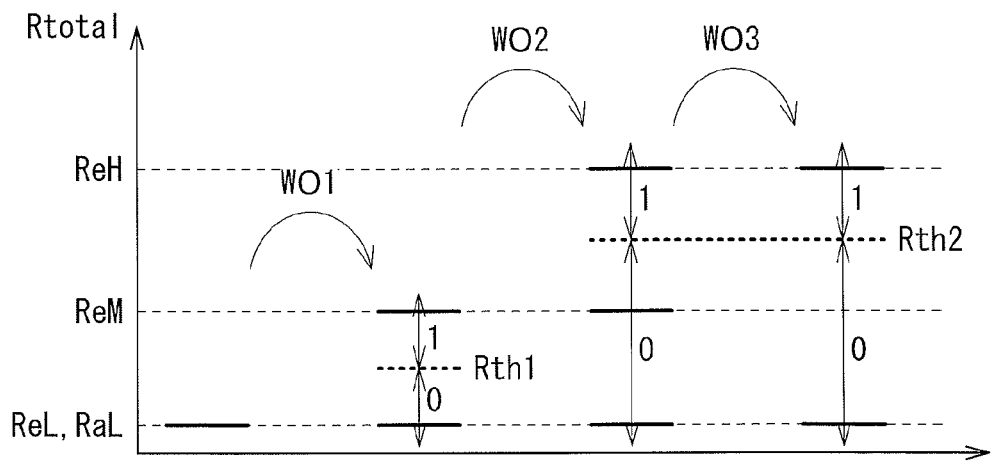
FIG. 8 is another characteristic diagram illustrating a characteristic example of the memory element illustrated in FIG. 1.

FIG. 8 illustrates the resistance value RR of the entire memory element 10 before and after each of first to third writing operations WO1 to WO3.

In the initial state before performing the first writing operation WO1, as described above, the electrical fuse 11 is in the low resistive state (the resistance value ReL), and the antifuse 12 is in the high resistive state (the resistance value RaH). Therefore, the resistance value RR is substantially equal to the resistance value ReL.

In the first writing operation WO1, when writing "1" to the memory element 10, the write section 20 applies the stress ST1 to the memory element 10, thereby changing the resistive state of the electrical fuse 11 from the low resistive state (the resistance value ReL) to the middle resistive state (the resistance value ReM). At this moment, the state of the antifuse 12 remains in the high resistive state (the resistance value RaH). Therefore, the resistance value RR of the entire memory element 10 is substantially equal to the resistance value ReM. When writing "0" to the memory element 10, the write section 20 does not apply a stress to the memory element 10. Therefore, the resistive state of the electrical fuse 11 remains in the low resistive state (the resistance value ReL), and the resistive state of the antifuse 12 remains in the high resistive state (the resistance value RaH). Thus, the resistance value RR is substantially equal to the resistance value ReL.

The memory state of "1" or "0" of the memory element 10 after the writing operation WO1 is identifiable by making a comparison with the resistance value Rth1 of the resistor 45 serving as a threshold. Specifically, it is possible to determine the memory state in the memory element 10 as follows. The readout section 30 generates the readout voltage Vread corresponding to the resistance value RR of the memory element 10, the reference-voltage generation section 40 generates the reference voltage Vref corresponding to the resistance value Rth1 of the resistor 45, and the comparator 50 compares the readout voltage Vread with the reference voltage Vref.

In the second writing operation WO2, when writing "1" to the memory element 10, the write section 20 applies the stress ST2 to the memory element 10, thereby changing the resistive state of the electrical fuse 11 to the high resistive state (the resistance value ReH). At this moment, the state of the antifuse 12 remains in the high resistive state (the resistance value RaH). Therefore, the resistance value RR of the entire memory element 10 is substantially equal to the resistance value ReH. When writing "0" to the memory element 10, the write section 20 does not apply a stress to the memory element 10. Thus, the resistive state of the electrical fuse 11 remains in the low resistive state (the resistance value ReL) or the middle resistive state (the resistance value ReM), and the resistive state of the antifuse 12 remains in the high resistive state (the resistance value RaH). Hence, the resistance value RR is substantially equal to the resistance value ReL or the resistance value ReM.

The memory state of "1" or "0" of the memory element 10 after the writing operation WO2 is identifiable by making a comparison with the resistance value Rth2 of the resistor 46 serving as a threshold. Specifically, it is possible to determine the memory state in the memory element 10 as follows. The readout section 30 generates the readout voltage Vread corresponding to the resistance value RR of the memory element 10, the reference-voltage generation section 40 generates the reference voltage Vref corresponding to the resistance value Rth2 of the resistor 46, and the comparator 50 compares the readout voltage Vread with the reference voltage Vref.

In the third writing operation WO3, when writing "1" to the memory element 10, the write section 20 applies the stress ST2 to the memory element 10, thereby changing the resistive state of the electrical fuse 11 to the high resistive state (the resistance value ReH). At this moment, the state of the antifuse 12 remains in the high resistive state (the resistance value RaH). Therefore, the resistance value RR of the entire memory element 10 is substantially equal to the resistance value ReH. When writing "0" to the memory element 10, the write section 20 applies the stress ST3 to the memory element 10, thereby changing the resistive state of the antifuse 12 from the high resistive state (the resistance value RaH) to the low resistive state (the resistance value RaL). Thus, the resistance value RR is substantially equal to the resistance value RaL.

The memory state of "1" or "0" of the memory element 10 after the writing operation WO3 is identifiable by making a comparison with the resistance value Rth2 of the resistor 46 serving as a threshold, in a manner similar to that after the second writing operation WO2. In other words, it is possible to use the same threshold at both of the time after the writing operation WO3 and the time after the writing operation WO2.

In the semiconductor device 1, information about the number of writing operations performed in the past is stored in the memory 9. At the time of writing information to the memory element 10, which one of the writing operations WO1 to WO3 is to be used to write the information is determined by the control section 8, based on the information stored in the memory 9. Further, at the time of reading information from the memory element 10, the threshold (the resistance value Rth1 or Rth2) is selected by the control section 8, based on the information stored in the memory 9.

(Writing Operations WO1 to WO3)

Next, the writing operations WO1 to WO3 will be described in detail. In the semiconductor device 1, the resistance value RR of the entire memory element 10 is set as illustrated in FIG. 8, by applying the stresses ST1 to ST3 to the memory element 10 in the writing operations WO1 to WO3. When applying the stresses ST1 to ST3, the control section 8 sets the stress conditions based on the information stored in the memory 9 and information to be written, and then applies the stresses ST1 to ST3.

Figure 9:
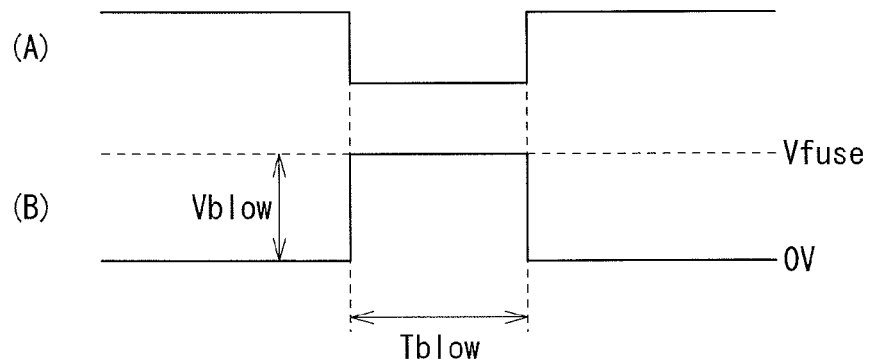
FIG. 9 is a waveform chart illustrating a stress to the memory element illustrated in FIG. 1.

FIG. 9 illustrates a stress applied to the memory element 10. Part (A) of FIG. 9 illustrates a waveform of the control signal Sw, and Part (B) of FIG. 9 illustrates a voltage waveform of the stress applied to the memory element 10. When applying the stress, the control section 8 sets the voltage Vdc and the voltage Vfuse, and generates the control signal Sw having a pulse shape (Part (A) of FIG. 9). This causes the write transistor 22 to be in ON state over only a time period (a time Tblow) during which the control signal Sw is at low level, thereby applying the voltage Vfuse to the memory element 10 (Part (B) of FIG. 9). The control section 8 generates and outputs the voltages Vfuse and Vdc as well as the control signal Sw, corresponding to any of the stresses ST1 to ST3 to be applied.

Figure 10:
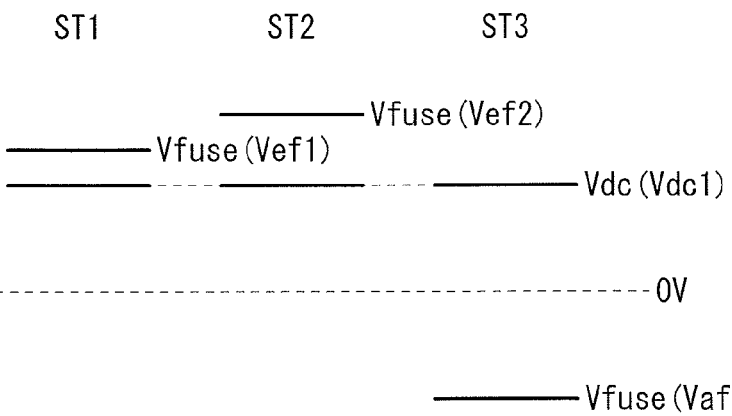
FIG. 10 is an explanatory diagram illustrating a stress to the memory element illustrated in FIG. 1.

FIG. 10 illustrates the voltage Vfuse and the voltage Vdc when the stresses ST1 to ST3 are applied. The voltage Vfuse is the positive voltage Vef1, when the stress ST1 is applied. The voltage Vfuse is the voltage Vef2 larger than the voltage Vef1, when the stress ST2 is applied. The voltage Vfuse is the negative voltage Vaf, when the stress ST3 is applied. Further, the voltage Vdc is the positive voltage Vdc1, when the stresses ST1 to ST3 are applied. In other words, when applying the stresses ST1 and ST2, the control section 8 outputs, as the voltage Vfuse, the voltages Vef1 and Vef2, respectively, which have the same polarity as that of the voltage Vdc1. When applying the stress ST3, the control section 8 generates, as the voltage Vfuse, the voltage Vaf having the polarity opposite to that of the voltage Vdc1.

Further, the control section 8 generates the control signals Sw having different pulse widths, between the stresses ST1 to ST3. Specifically, for example, the pulse width in the stress ST2 may be wider than that in the stress ST1. Thus, in the stress ST2, a higher blow voltage Vblow (the voltage Vef2) is applied to the memory element 10 over the longer time Tblow, and therefore the blow current Iblow (FIG. 4) becomes larger, as compared with the stress ST1.

Next, operation in applying the stresses ST1 to ST3 will be described.

Figure 11:
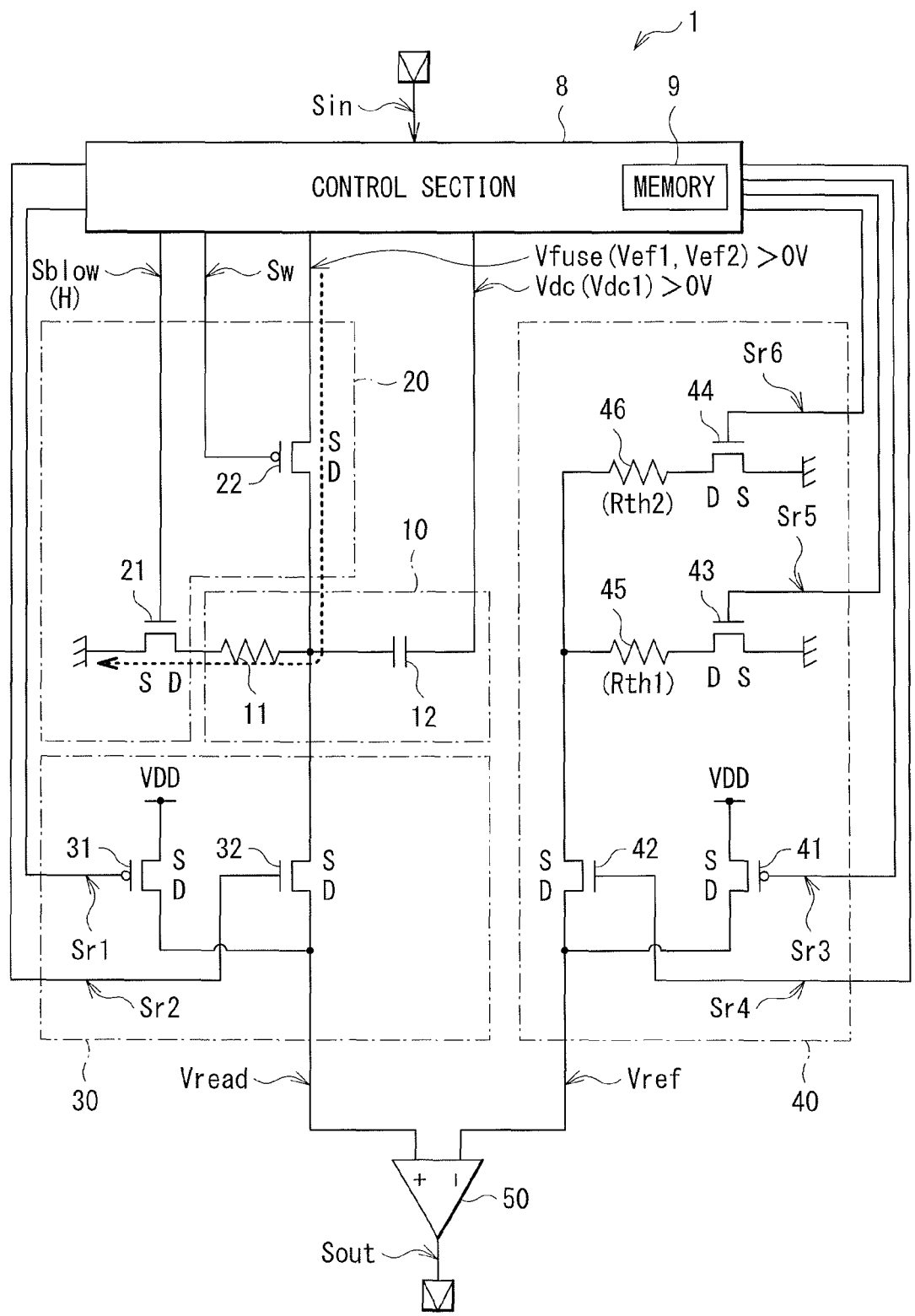
FIG. 11 is a circuit diagram illustrating an example of writing operation by which information is written to the memory element illustrated in FIG. 1.

FIG. 11 illustrates operation in applying the stresses ST1 and ST2. When applying the stresses ST1 and ST2, the control section 8 causes the control signal Sblow to be at high level, and also causes the voltage Vdc to be the positive voltage Vdc1. As a result, the blow transistor 21 enters ON state, the other end of the electrical fuse 11 is grounded, and the voltage Vdc1 is applied to the other end of the antifuse 12.

Then, to the memory element 10, the control section 8 outputs the positive voltages Vef1 and Vef2 corresponding to the stresses ST1 and ST2, respectively, as the voltage Vfuse, and outputs a pulse waveform as the control signal Sw, as illustrated in FIGS. 9 and 10. As a result, over the time period (the time Tblow) during which the control signal Sw is at low level, the voltages Vef1 and Vef2 are applied to the one end of the electrical fuse 11, and a current flows through the write transistor 22, the electrical fuse 11, and the blow transistor 21 in this order. In other words, a current flows between both ends of the electrical fuse 11, and the resistance value of the electrical fuse 11 changes to the middle resistive state (the resistance value ReM) when the stress ST1 is applied, and to the high resistive state (the resistance value ReH) when the stress ST2 is applied.

At that time, the voltages Vef1 and Vef2 are positive voltages which are the same as the voltage Vdc1, and thus the antifuse 12 is able to maintain the high resistive state. In other words, for example, when 0 V instead of the positive voltage Vdc1 is applied to the other end of the antifuse 12, a potential difference between both ends of the antifuse 12 may be the voltages Vef1 and Vef2. Therefore, the resistive state of the antifuse 12 may change when the voltages Vef1 and Vef2 are sufficiently large. Meanwhile, similarly, in the invention described in Japanese Unexamined Patent Application Publication No. 2000-174211, for example, when a stress used to increase the resistance value of the electrical fuse is applied, the same voltage as that of the stress may be applied to the antifuse. Therefore, the resistive state of this antifuse may change. In the semiconductor device 1, however, the voltages Vef1 and Vef2 are voltages of the same polarity as that of the voltage Vdc1. Therefore, it is possible to reduce the potential difference between both ends of the antifuse 12, and thus to lower a possibility of a change in the resistive state of the antifuse 12. This makes it possible to increase reliability of the stored information, in the semiconductor device 1.

Figure 12:
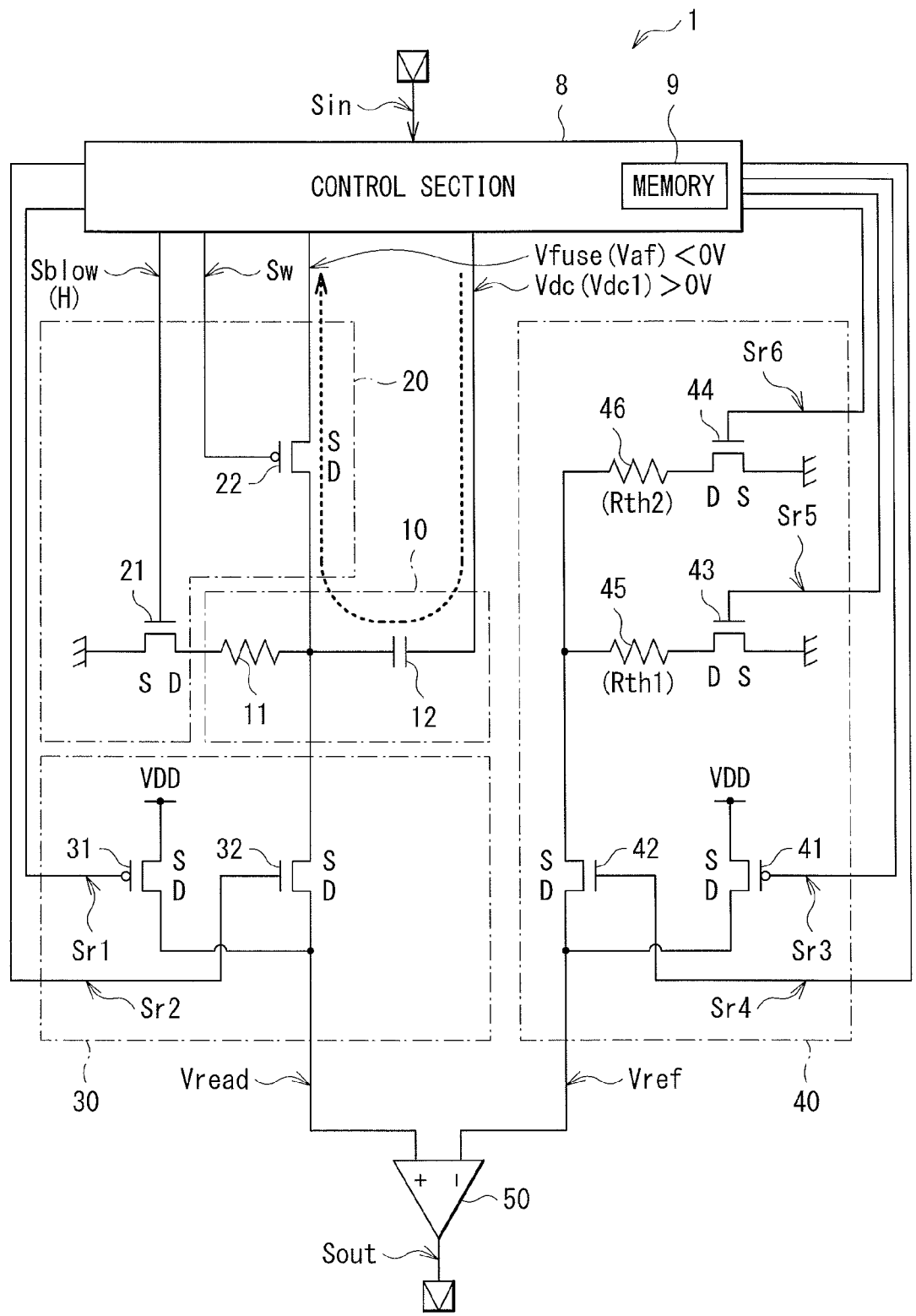
FIG. 12 is a circuit diagram illustrating another example of the writing operation by which information is written to the memory element illustrated in FIG. 1.

FIG. 12 illustrates operation in applying the stress ST3. When applying the stress ST3, the control section 8 outputs the negative voltage Vaf as the voltage Vfuse, and also outputs a pulse waveform as the control signal Sw, as illustrated in FIGS. 9 and 10. As a result, over the time period (the time Tblow) during which the control signal Sw is at low level, the voltage Vaf is applied to the other end of the antifuse 12, and a potential difference (Vdc1−Vaf=Vdc1+|Vaf|) occurs between both ends of the antifuse 12. Further, the antifuse 12 changes from the high resistive state (the resistance value RaH) to the low resistive state (the resistance value RaL), and a current flows through the antifuse 12 and the write transistor 22 in this order.

At that time, the voltage Vaf is a negative voltage different from the voltage Vdc1, and thus the antifuse 12 is able to change the resistive state more reliably. In other words, for example, when 0 V instead of the positive voltage Vdc1 is applied to the other end of the antifuse 12, the potential difference between both ends of the antifuse 12 may be |Vaf| (an absolute value of the voltage Vaf). Therefore, when the absolute value of the voltage Vaf is not large enough, the resistive state of the antifuse 12 may not change sufficiently. In the semiconductor device 1, however, the voltage Vaf is the voltage of the polarity different from that of the voltage Vdc1. Therefore, it is possible to increase the potential difference between both ends of the antifuse 12 and to change the resistive state of the antifuse 12 more reliably.

In this way, the resistive states of the electrical fuse 11 and the antifuse 12 are changed by the stresses ST1 to ST3. In the semiconductor device 1, the resistance value RR of the entire memory element 10 is set as illustrated in FIG. 8, by applying the above-described stresses ST1 to ST3 to the memory element 10 in the writing operations WO1 to WO3.

(Reading Operation)

Next, reading operation after information is written by each of the writing operations WO1 to WO3 will be described. When reading information from the memory element 10, the control section 8 sets a reading condition (the reference voltage Vref), based on the information about the number of writing operations performed in the past, which is stored in the memory 9.

Figure 13:
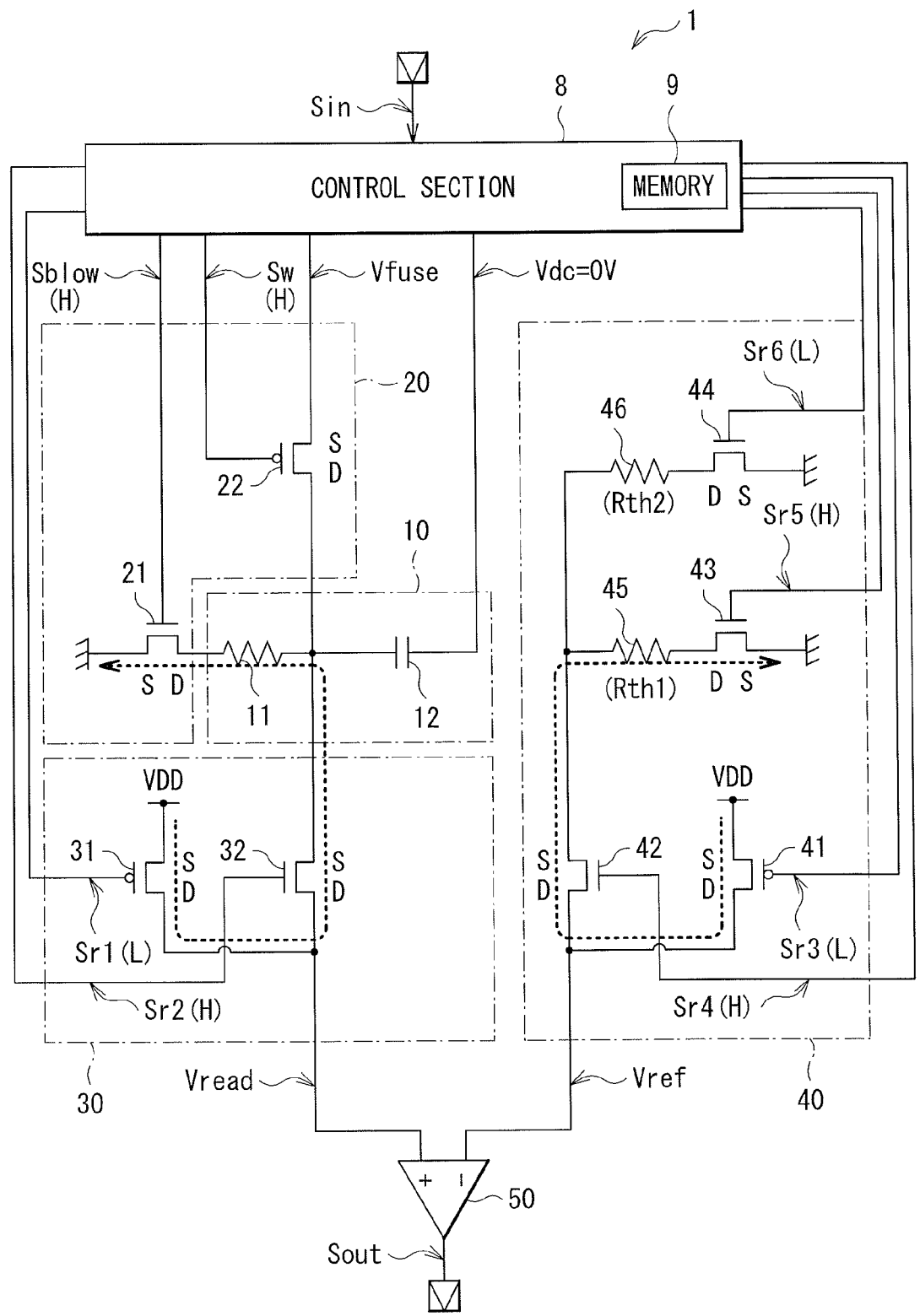
FIG. 13 is a circuit diagram illustrating an example of reading operation by which information is read from the memory element illustrated in FIG. 1.

FIG. 13 illustrates information reading operation after the writing operation WO1. When reading information from the memory element 10 after the writing operation WO1, the control section 8 causes the control signal Sblow to be at high level, and the control signal Sw to be at high level, and the voltage Vdc to be 0 V. As a result, the blow transistor 21 enters ON state, the other end of the electrical fuse 11 is grounded, the write transistor 22 enters OFF state, and 0 V is applied to the other end of the antifuse 12. Further, the control section 8 causes the control signal Sr2 to be at high level and also the control signal Sr1 to be at low level. As a result, the transistors 31 and 32 enter ON state, and a current flows through the transistor 31, the transistor 32, the electrical fuse 11, and the blow transistor 21 in this order. In other words, after the writing operation WO1, as illustrated in FIG. 8, the electrical fuse 11 is in the low resistive state (the resistance value ReL) or the middle resistive state (the resistance value ReM), and the antifuse 12 is in the high resistive state (the resistance value RaH). Therefore, the current hardly flows through the antifuse 12. In this way, the readout section 30 outputs the readout voltage Vread corresponding to the resistance value RR (FIG. 8) of the entire memory element 10.

Further, the control section 8 causes the control signal Sr3 to be at low level and also the control signal Sr4 to be at high level. This causes the transistors 41 and 42 to be in ON state. Then, the control section 8 orders the reference-voltage generation section 40 to generate the reference voltage Vref based on the resistor 45 (the resistance value Rth1). Specifically, the control signal Sr5 is caused to be at high level, and the control signal Sr6 is caused to be at low level. As a result, the transistor 43 enters ON state, the transistor 44 enters OFF state, and a current flows through the transistor 41, the transistor 42, the resistor 45, and the transistor 43 in this order. In this way, the reference-voltage generation section 40 generates and outputs the reference voltage Vref corresponding to the resistance value Rth1 of the resistor 45. Further, the comparator 50 compares the readout voltage Vread with the reference voltage Vref. In this way, in the semiconductor device 1, it is possible to read the information from the memory element 10.

Figure 14:
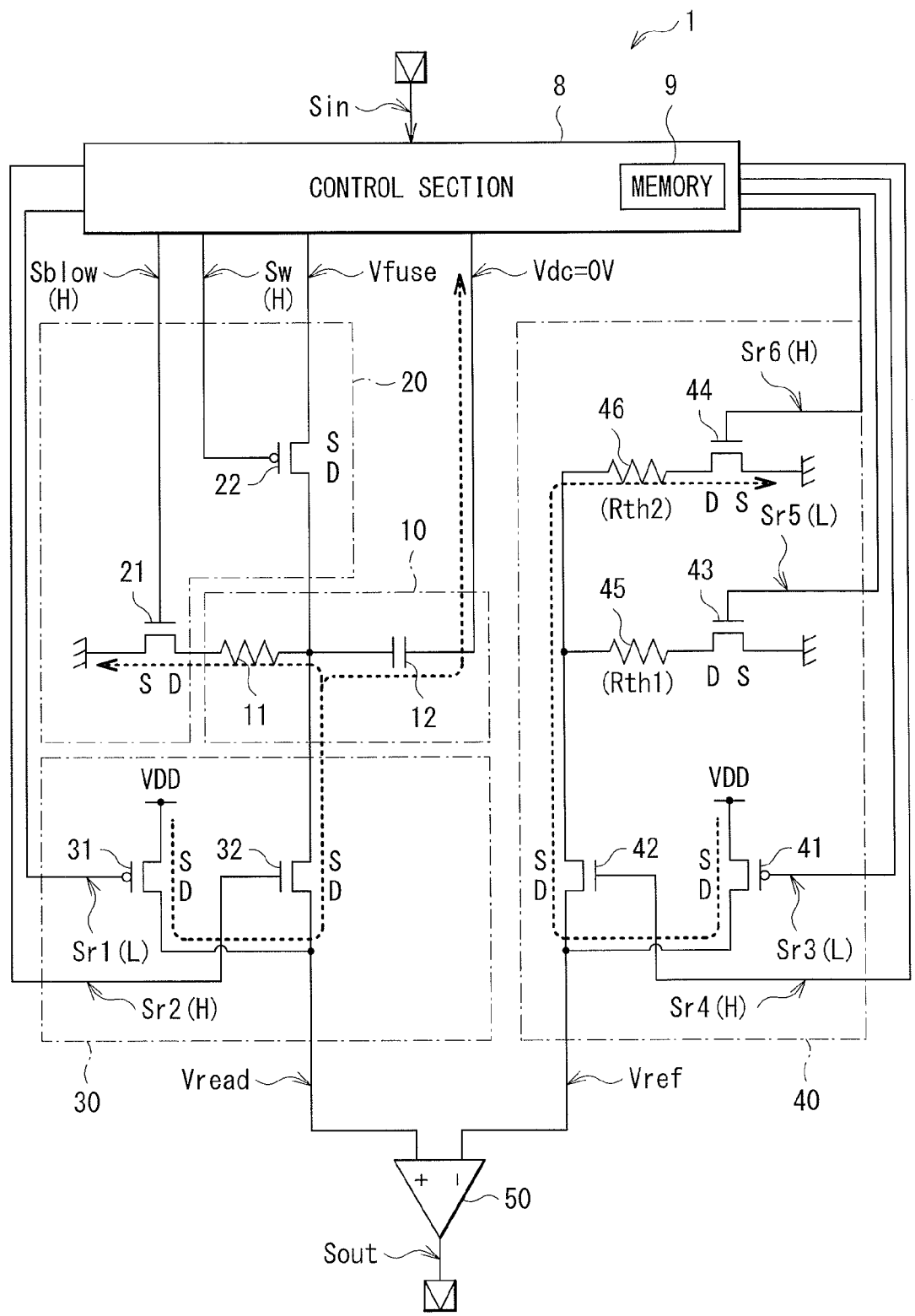
FIG. 14 is a circuit diagram illustrating another example of the reading operation by which information is read from the memory element illustrated in FIG. 1.

FIG. 14 illustrates information reading operation after the writing operations WO2 and WO3. After the writing operation WO2, a current flows through the transistor 31, the transistor 32, the electrical fuse 11, and the blow transistor 21 in this order, in a manner similar to that after the writing operation WO2. In other words, after the writing operation WO2, as illustrated in FIG. 8, the antifuse 12 is in the high resistive state (the resistance value RaH), and thus a current hardly flows through the antifuse 12. Further, after the writing operation WO3, when the antifuse 12 is in the high resistive state (the resistance value RaH), a current flows through the transistor 31, the transistor 32, the electrical fuse 11, and the blow transistor 21 in this order likewise. When the antifuse 12 is in the low resistive state (the resistance value RaL), a current flows through the transistor 31, the transistor 32, and the antifuse 12 in this order. In this way, the readout section 30 outputs the readout voltage Vread corresponding to the resistance value RR (FIG. 8) of the entire memory element 10.

Further, the control section 8 orders the reference-voltage generation section 40 to generate the reference voltage Vref based on the resistor 46 (the resistance value Rth2). Specifically, the control signal Sr5 is caused to be at low level, and the control signal Sr6 is caused to be at high level. As a result, the transistor 43 enters OFF state, the transistor 44 enters ON state, and a current flows through the transistor 41, the transistor 42, the resistor 46, and the transistor 44 in this order. In this way, the reference-voltage generation section 40 generates and outputs the reference voltage Vref corresponding to the resistance value Rth2 of the resistor 46. The comparator 50 then compares the readout voltage Vread with the reference voltage Vref. In this way, in the semiconductor device 1, it is possible to read the information from the memory element 10.

[Effects]

As described above, in the present embodiment, the antifuse is provided in addition to the electrical fuse, and therefore it is possible to increase the number of times information is rewritten.

In the present embodiment, at the time of applying a stress to the electrical fuse, the positive voltage Vdc1 is applied to the other end of the antifuse, and the voltage Vfuse (the voltage Vef1 or Vef2) of the same polarity as that of the voltage Vdc1 is applied to the one end of the antifuse and the one end of the electrical fuse. Therefore, it is possible to reduce the possibility of a change in the resistive state of the antifuse and to increase the reliability.

In the present embodiment, at the time of applying a stress to the antifuse, the voltage Vfuse (the voltage Vaf) of the polarity different from that of the voltage Vdc1 is applied to the one end of the antifuse and the one end of the electrical fuse. Therefore, it is possible to change the resistive state of the antifuse more reliably.

[Modification 1]

Figure 15:
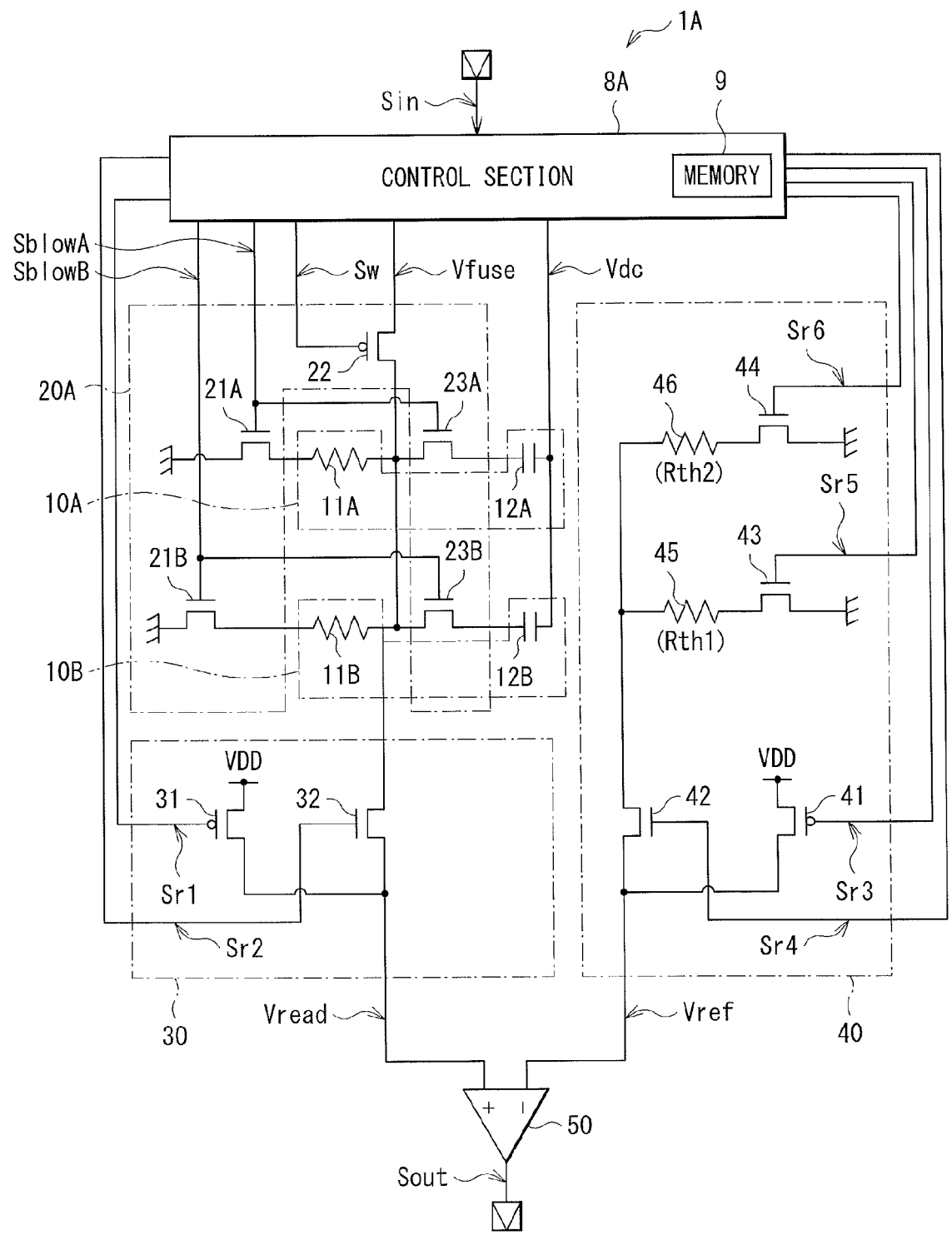
FIG. 15 is a circuit diagram illustrating a configuration example of a semiconductor device according to a modification.

In the above-described embodiment, the one memory element 10 is provided, the present technology is not limited thereto. Instead of this, for example, as illustrated in FIG. 15, a plurality of memory elements (in this modification, two memory elements 10A and 10B) may be provided. A semiconductor device 1A includes a control section 8A, the memory elements 10A and 10B, a write section 20A, and a control section 8A. The control section 8A outputs control signals SblowA and SblowB.

The memory element 10A includes an electrical fuse 11A and an antifuse 12A. One end of the electrical fuse 11A is connected to a drain of a transistor 23A of the write section 20A and also connected to the drain of the write transistor 22, and the like. The other end of the electrical fuse 11A is connected to a drain of a blow transistor 21A of the write section 20A. One end of the antifuse 12A is connected to a source of the transistor 23A, and the other end of the same is supplied with the voltage Vdc from the control section 8A.

The memory element 10B includes an electrical fuse 11B and an antifuse 12B. One end of the electrical fuse 11B is connected to a drain of a transistor 23B of the write section 20A, and also connected to the drain of the write transistor 22, and the like. The other end of the electrical fuse 11B is connected to a drain of a blow transistor 21B of the write section 20A. One end of the antifuse 12B is connected to a source of the transistor 23B, and the other end of the same is supplied with the voltage Vdc from the control section 8A.

The write section 20A includes the blow transistors 21A and 21B, as well as the transistors 23A and 23B. Of the blow transistor 21A, the drain is connected to the other end of the electrical fuse 11A, the gate is connected to the gate of the transistor 23A and supplied with the control signal SblowA from the control section 8A, and the source is grounded. Of the blow transistor 21B, the drain is connected to the other end of the electrical fuse 11B, the gate is connected to the gate of the transistor 23B and supplied with the control signal SblowB from the control section 8A, and the source is grounded. The transistor 23A may be configured of, for example, an N-channel MOS FET. The drain of the transistor 23A is connected to the one end of the electrical fuse 11A, and also connected to the drain of the write transistor 22, and the like. The gate of the transistor 23A is connected to the gate of the blow transistor 21A and supplied with the control signal SblowA from the control section 8A, and the source of the same is connected to the one end of the antifuse 12A. The transistor 23B may be configured of, for example, an N-channel MOS FET. The drain of the transistor 23B is connected to the one end of the electrical fuse 11B, and also connected to the drain of the write transistor 22, and the like. The gate of the transistor 23B is connected to the gate of the blow transistor 21B and supplied with the control signal SblowB from the control section 8A, and the source of the same is connected to the one end of the antifuse 12B.

With this configuration, in the semiconductor device 1A, it is possible to write information to the memory elements 10A and 10B, and to read information from the memory elements 10A and 10B. Specifically, for example, information may be written to or read from the memory element 10A, by causing the control signal SblowA to be at high level and the control signal SblowB to be at low level. Similarly, for example, information may be written to or read from the memory element 10B, by causing the control signal SblowA to be at low level and the control signal SblowB to be at high level.

[Modification 2]

Figure 16:
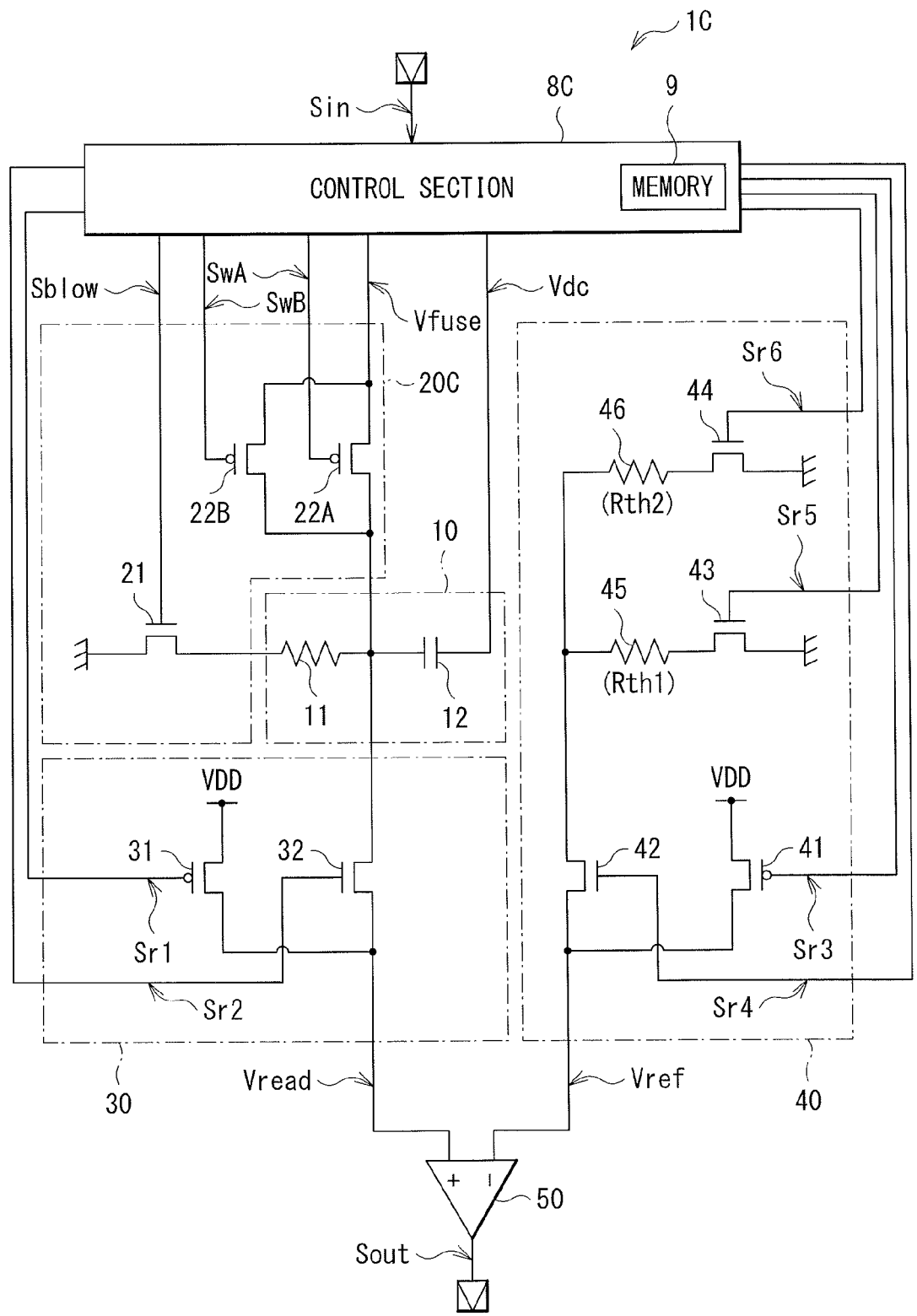
FIG. 16 is a circuit diagram illustrating a configuration example of a semiconductor device according to another modification.

In the above-described embodiment, the voltage Vfuse (the voltage Vef1) at the time of applying the stress ST1 is different from the voltage Vfuse (the voltage Vef2) at the time of applying the stress ST2, the present technology is not limited thereto. Instead of this, for example, as illustrated in FIG. 16, while the voltages Vfuse at the time of applying the stresses ST1 and ST2 may be the same, a plurality of (two, in this modification) paths used to supply the blow current Iblow to the memory element 10 may be provided. The different stresses ST1 and ST2 may be applied by switching the number of paths. A semiconductor device 1C includes a control section 8C and a write section 20C. The control section 8C outputs control signals SwA and SwB. The write section 20C includes write transistors 22A and 22B. The drains of the write transistors 22A and 22B are connected to each other and supplied with the voltage Vfuse from the control section 8C, and the sources thereof are connected to each other and also connected to the one end of the electrical fuse 11, the one end of the antifuse 12, and the like. The control signal SwA is supplied from the control section 8C to the gate of the write transistor 22A, and the control signal SwB is supplied from the control section 8C to the gate of the write transistor 22B.

[Modification 3]

Figure 17:
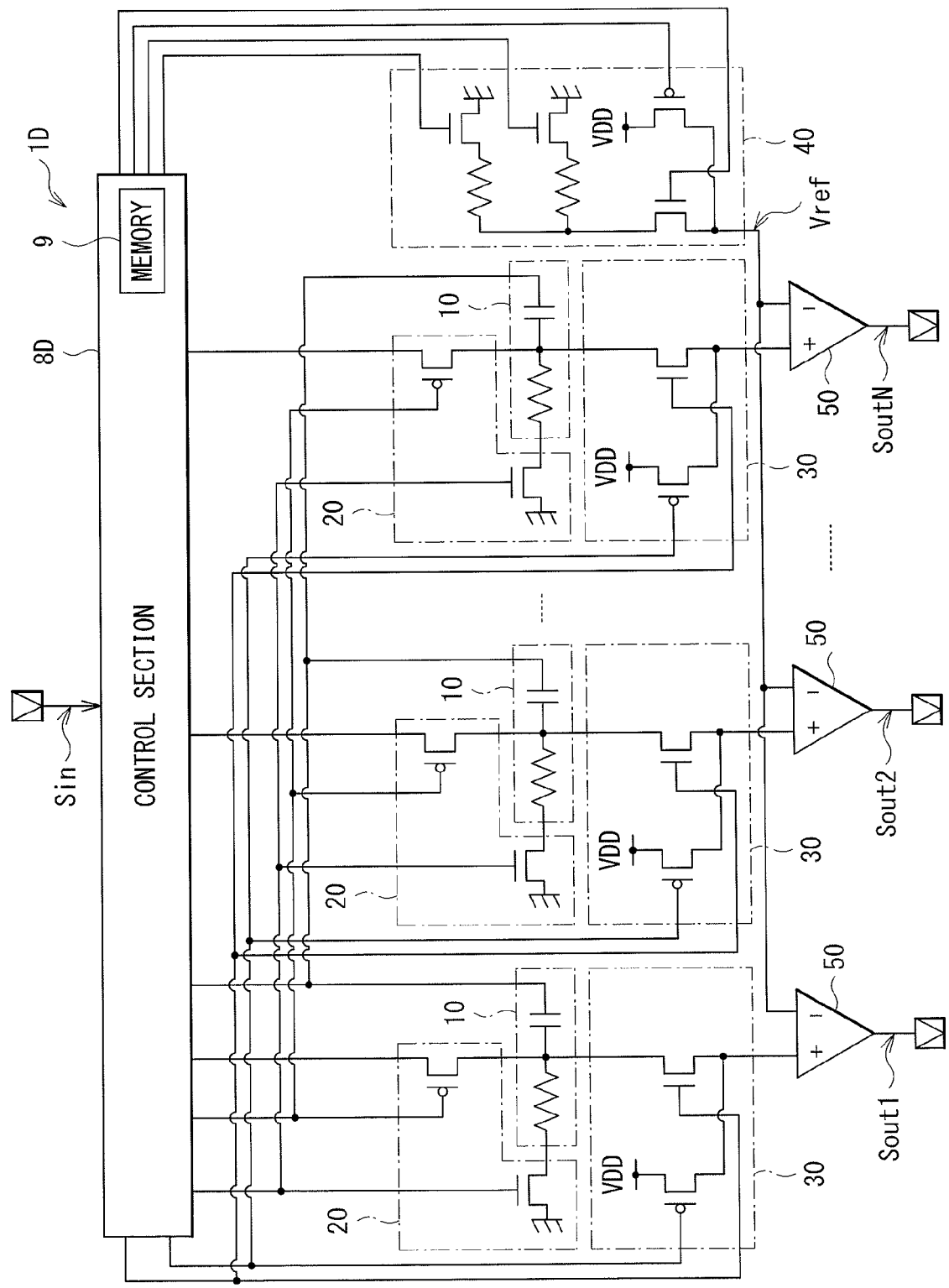
FIG. 17 is a circuit diagram illustrating a configuration example of a semiconductor device according to still another modification.

In the above-described embodiment, one set of the memory element 10, the write section 20, the readout section 30, and the comparator 50 is provided, the present technology is not limited thereto. Instead of this, for example, as illustrated in FIG. 17, a plurality of sets (N sets, in this modification) may be provided. In this modification, the one reference-voltage generation section 40 is provided, and the reference voltage Vref generated by the reference-voltage generation section 40 is supplied to the N number of comparators 50. This configuration makes it possible to store N-bit information.

The present technology has been described above with reference to some embodiment and modifications, but is not limited thereto and may be variously modified.

For example, in the above-described embodiment, the memory element 10 is configured using the electrical fuse 11 having the three identifiable resistive states, but is not limited thereto. Instead of this, for example, an electrical fuse having two or four or more identifiable resistive states may be used.

It is to be noted that the present technology may be configured as follows.

(1) A memory element including:
   an electrical fuse provided to be inserted between a first input node and a second input node; and
   an antifuse provided to be inserted between the second input node and a third input node, the third input node being configured to be a node to which a voltage is allowed to be applied separately from a voltage to be applied to the first input node.

(2) The memory element according to (1), wherein
   the first input node is grounded, and
   the electrical fuse having a resistive state to be changed by application of a first stress voltage to the second input node, the first stress voltage having a same polarity as a polarity of a voltage applied to the third input node.

(3) The memory element according to (2), wherein the antifuse has a resistive state to be changed by application of a second stress voltage to the second input node, the second stress voltage having a polarity different from the polarity of the voltage applied to the third input node.

(4) The memory element according to (2) or (3), wherein the electrical fuse is capable of being in any of three or more identifiable resistive states.

(5) The memory element according to (4), wherein
the electrical fuse includes a first current-carrying layer and a second current-carrying layer formed on the first current-carrying layer, in a state before the stress voltage is applied, and
the first stress voltage changes a state of one or each state of both of the first current-carrying layer and the second current-carrying layer, thereby changing the resistive state of the electrical fuse.

(6) The memory element according to (5), wherein
the first current-carrying layer is formed of polysilicon, and the second current-carrying layer is formed of silicide.

(7) The memory element according to (4), wherein
the resistive state of the electrical fuse is changed from a low resistive state to a middle resistive state, by application of the first stress voltage to the second input node, and
the resistive state of the electrical fuse is changed from the low resistive state or the middle resistive state to a high resistive state, by application of a third stress voltage to the second input node, the third stress voltage having a same polarity as the polarity of the voltage applied to the third input node, and the third stress voltage generating a potential difference between the first input node and the second input node larger than a potential difference generated by the first stress voltage.

(8) A semiconductor device including:
an electrical fuse provided to be inserted between a first input node and a second input node;
an antifuse provided to be inserted between the second input node and a third input node; and
a control section configured to apply a stress voltage to the second input node, and to apply a voltage to each of the first input node and the third input node separately.

(9) The semiconductor device according to (8), wherein the control section applies voltages different from each other to the first input node and the third input node, respectively, when applying the stress voltage to the second input node.

(10) The semiconductor device according to (8) or (9), wherein
the control section is configured to
ground the first input node,
change a resistive state of the electrical fuse, by applying a first stress voltage to the second input node, the first stress voltage having a same polarity as a polarity of a voltage applied to the third input node, and
change a resistive state of the antifuse, by applying a second stress voltage to the second input node, the second stress voltage having a polarity different from the polarity of the voltage applied to the third input node.

(11) The semiconductor device according to (10), wherein the control section changes the resistive state of the antifuse, after changing the resistive state of the electrical fuse.

(12) The semiconductor device according to (11), wherein the control section is configured to
change the resistive state of the electrical fuse from a low resistive state to a middle resistive state, by applying the first stress voltage to the second input node,
change the resistive state of the electrical fuse from the low resistive state or the middle resistive state to a high resistive state, by applying a third stress voltage to the second input node, the third stress voltage having a same polarity as the polarity of the voltage applied to the third input node, and the third stress voltage generating a potential difference between the first input node and the second input node larger than a potential difference generated by the first stress voltage, and
change the resistive state of the antifuse from the high resistive state to the low resistive state, by applying the second stress voltage to the second input node.

(13) The semiconductor device according to (12), further including:
a voltage generation section configured to generate a threshold voltage; and
a comparator configured to compare a voltage corresponding to a combination of the resistive state in the electrical fuse and the resistive state in the antifuse, with the threshold voltage, wherein
the voltage generation section is configured to change a value of the threshold voltage, after application of the first stress voltage to the second input node is completed.

(14) A writing method including:
applying a first stress voltage to a second input node of a memory element to change a resistive state of an electrical fuse, the memory element including the electrical fuse provided to be inserted between a first input node and the second input node, and an antifuse provided to be inserted between the second input node and a third input node, the first stress voltage having a same polarity as a polarity of a voltage of the third input node; and
applying a second stress voltage to the second input node of the memory element to change a resistive state of the antifuse, the second stress voltage having a polarity different from the polarity of the voltage of the third input node.

It should be understood by those skilled in the art that various modifications, combinations, sub-combinations, and alterations may occur depending on design requirements and other factors insofar as they are within the scope of the appended claims or the equivalents thereof.

What is claimed is:

1. A memory element comprising:
an electrical fuse between a first node and a second node;
a first switch coupled to the first node and a second switch coupled to the second node; and
an antifuse between the second node and a third node, the first and the third nodes being separate to accept separate voltages.

2. The memory element according to claim 1, wherein:
one side of the first switch is grounded, and
the electrical fuse has a variable resistive state that can be changed by application of a first stress voltage to the second node, the first stress voltage having a same polarity as a polarity of a voltage applied to the third node.

3. The memory element according to claim 2, wherein the antifuse has a variable resistive state that can be changed by application of a second stress voltage to the second node, the second stress voltage having a polarity different from the polarity of the voltage applied to the third node.

4. The memory element according to claim 2, wherein the electrical fuse is capable of being in any of three or more identifiable resistive states.

5. The memory element according to claim 4, wherein:
the electrical fuse includes a first current-carrying layer and a second current-carrying layer formed on the first current-carrying layer, in a state before the stress voltage is applied, and the first stress voltage changes a state of one or each state of both of the first current-carrying layer and the second current-carrying layer, thereby changing the resistive state of the electrical fuse.

6. The memory element according to claim 5, wherein:
the first current-carrying layer is formed of polysilicon, and the second current-carrying layer is formed of silicide.

7. The memory element according to claim 4, wherein:
the resistive state of the electrical fuse changes from a low resistive state to a middle resistive state, by application of the first stress voltage to the second node, and
the resistive state of the electrical fuse changes from the low resistive state or the middle resistive state to a high resistive state, by application of a third stress voltage to the second node, the third stress voltage having a same polarity as the polarity of the voltage applied to the third node, and the third stress voltage generating a potential difference between the first node and the second node larger than a potential difference generated by the first stress voltage.

8. A semiconductor device comprising:
an electrical fuse between a first node and a second node;
an antifuse between the second node and a third node;
a first switch coupled to the first node and a second switch coupled to the second node; and
a control section coupled to the first and second switches and configured to apply a stress voltage to the second node, and to separately apply respective voltages to the first node and the third node.

9. The semiconductor device according to claim 8, wherein the control section applies voltages of different polarities to the first node and the third node, respectively, when applying the stress voltage to the second node.

10. The semiconductor device according to claim 8, wherein the control section is configured to:
ground the first node,
change a resistive state of the electrical fuse, by applying a first stress voltage to the second node, the first stress voltage having a same polarity as a polarity of a voltage applied to the third node, and
change a resistive state of the antifuse, by applying a second stress voltage to the second node, the second stress voltage having a polarity different from the polarity of the voltage applied to the third node.

11. The semiconductor device according to claim 10, wherein the control section is configured to change the resistive state of the antifuse, after changing the resistive state of the electrical fuse.

12. The semiconductor device according to claim 11, wherein the control section is configured to:
change the resistive state of the electrical fuse from a low resistive state to a middle resistive state, by applying the first stress voltage to the second node,
change the resistive state of the electrical fuse from the low resistive state or the middle resistive state to a high resistive state, by applying a third stress voltage to the second node, the third stress voltage having a same polarity as the polarity of the voltage applied to the third node, and the third stress voltage generating a potential difference between the first node and the second node larger than a potential difference generated by the first stress voltage, and
change the resistive state of the antifuse from the high resistive state to the low resistive state, by applying the second stress voltage to the second node.

13. The semiconductor device according to claim 12, further comprising:
a voltage generation section configured to generate a threshold voltage; and
a comparator configured to compare a voltage corresponding to a combination of the resistive state in the electrical fuse and the resistive state in the antifuse, with the threshold voltage,
wherein,
the voltage generation section is configured to change a value of the threshold voltage, after application of the first stress voltage to the second node is completed.

14. A writing method comprising:
applying a first stress voltage to a second node of a memory element to change a resistive state of an electrical fuse, the memory element including the electrical fuse between a first node and the second node, and an antifuse between the second node and a third node, the first stress voltage having a same polarity as a polarity of a voltage of the third node; and
applying a second stress voltage to the second node of the memory element to change a resistive state of the antifuse, the second stress voltage having a polarity different from the polarity of the voltage of the third node,
wherein,
a first switch is coupled to the first node and a second switch is coupled to the second node; and
the application of the first and second stress voltages is effected at least in part by selective operation of the first and second switches.

* * * * *